United States Patent
Wu et al.

(10) Patent No.: US 9,774,310 B2
(45) Date of Patent: Sep. 26, 2017

(54) COMMON MODE NOISE SUPPRESSING DEVICE

(71) Applicant: National Taiwan University, Taipei (TW)

(72) Inventors: Tzong-Lin Wu, Taipei (TW); Yang-Chih Huang, Taipei (TW); Chih-Ying Hsiao, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 28 days.

(21) Appl. No.: 14/600,787

(22) Filed: Jan. 20, 2015

(65) Prior Publication Data

US 2015/0349739 A1    Dec. 3, 2015

(30) Foreign Application Priority Data

May 30, 2014 (TW) .............................. 103119076 A

(51) Int. Cl.
| | |
|---|---|
| H03H 7/01 | (2006.01) |
| H03H 7/42 | (2006.01) |
| H03H 7/09 | (2006.01) |
| H03H 7/12 | (2006.01) |
| H03H 7/19 | (2006.01) |
| H01F 17/00 | (2006.01) |

(52) U.S. Cl.
CPC ........ *H03H 7/0115* (2013.01); *H03H 7/1708* (2013.01); *H03H 7/1758* (2013.01); *H03H 7/427* (2013.01); *H01F 2017/0073* (2013.01); *H03H 7/0107* (2013.01); *H03H 7/0153* (2013.01); *H03H 7/09* (2013.01); *H03H 7/12* (2013.01); *H03H 7/19* (2013.01)

(58) Field of Classification Search
CPC ........ H03H 7/427; H03H 7/19; H03H 7/0115; H03H 2017/0472; H03H 9/009; H03H 7/07; H03H 7/065; H03H 7/1758; H03H 7/1708
USPC ................. 333/4, 5, 167, 175, 181, 168
See application file for complete search history.

(56) References Cited

U.S. PATENT DOCUMENTS

| | | | | |
|---|---|---|---|---|
| 3,474,181 A | * | 10/1969 | Ayres | ..................... G10H 1/045 331/106 |
| 6,556,096 B1 | * | 4/2003 | Ouacha | ................ H03H 11/265 333/138 |
| 8,125,299 B2 | * | 2/2012 | Alkan | ..................... H03H 1/00 333/175 |
| 2009/0251234 A1 | * | 10/2009 | Hirama | .................... H03H 5/00 333/169 |

(Continued)

*Primary Examiner* — Stephen E Jones
*Assistant Examiner* — Rakesh Patel
(74) *Attorney, Agent, or Firm* — Birch, Stewart, Kolasch & Birch, LLP

(57) ABSTRACT

An all-pass filtering module of a common mode noise suppressing device includes first and second differential transmission circuits coupled to a reference node. Each of the first and second differential transmission circuits has an input terminal and an output terminal, and includes: first and second capacitive elements coupled in series between the input terminal and the output terminal; a first inductor coupled between the input terminal and the output terminal; and a third capacitive element and a second inductor coupled in series between the reference node and a common node between the first and second capacitive elements.

15 Claims, 17 Drawing Sheets

(56) References Cited

U.S. PATENT DOCUMENTS

2010/0052820 A1\* 3/2010 Wu ................... H01P 1/20336
  333/204
2016/0276997 A1\* 9/2016 Teramoto ............... H03H 7/075

\* cited by examiner

COMMON MODE NOISE SUPPRESSING DEVICE

CROSS-REFERENCE TO RELATED APPLICATION

This application claims priority to Taiwanese Application No. 103119076, filed on May 30, 2014.

BACKGROUND OF THE INVENTION

1. Field of the Invention

This invention relates to a noise suppressing device, and more particularly to a common mode noise suppressing device.

2. Description of the Related Art

A conventional common mode noise suppressing device is mainly implemented with lumped elements, and usually uses characteristics of a symmetric differential transmission line whose intermediate potential is equivalently grounded. Thus, the conventional common mode noise suppressing device may provide two differential transmission paths, each of which is implemented with an inductively coupled all-pass filter or a low-pass filter.

However, when the inductively coupled all-pass filters are used, two electromagnetically coupled inductors are required in each differential transmission path while self-inductances and a mutual inductance of the inductors are required to be finely tuned so as to meet a required frequency response. Therefore, design of the conventional common node noise suppressing device is troublesome and time-consuming. On the other hand, when the low-pass filters are used, the conventional common mode noise suppressing device may have a limited operating frequency range.

SUMMARY OF THE INVENTION

Therefore, an object of the present invention is to provide a common mode noise suppressing device that can overcome the aforesaid drawbacks associated with the prior art.

According to this invention, a common mode noise suppressing device comprises:
at least one first all-pass filtering module including
  a first reference node, and
  a first differential transmission circuit and a second differential transmission circuit, each of which is coupled to the first reference node, has an input terminal and an output terminal, and includes
    a first capacitive element and a second capacitive element coupled in series between the input terminal and the output terminal,
    a first inductor coupled between the input terminal and the output terminal, and
    a third capacitive element and a second inductor coupled in series between the first reference node and a first common node between the first and second capacitive elements.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENT

Figure 1:
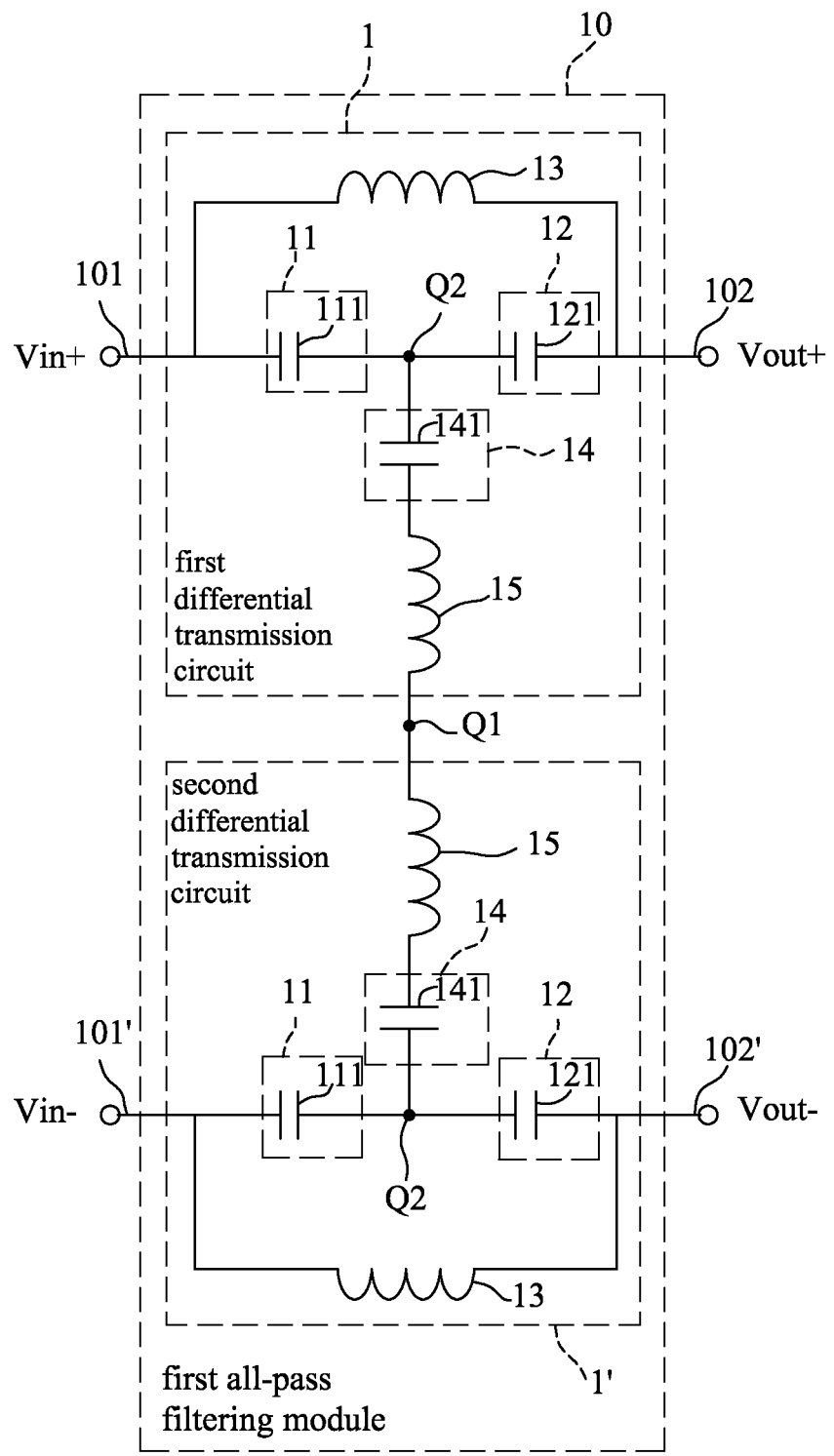
FIG. 1 is a schematic electrical circuit diagram illustrating the first preferred embodiment of a common mode noise suppressing device according to the present invention.

Before this invention is described in detail, it should be noted herein that throughout this disclosure, like elements are denoted by the same reference numerals. In addition, when two elements are described as being "coupled in series," "connected in series" or the like, it is merely intended to portray a serial connection between the two elements without necessarily implying that the currents flowing through the two elements are identical to each other and without limiting whether or not an additional element is coupled to a common node between the two elements. Essentially, "a series connection of elements," "a series coupling of elements" or the like as used throughout this disclosure should be interpreted as being such when looking at those elements alone.

Referring to FIG. 1, the first preferred embodiment of a common mode noise suppressing device according to the present invention is shown to include a first all-pass filtering module 10. The first all-pass filtering module 10 includes a first reference node (Q1), and first and second differential transmission circuits 1, 1'.

Each of the first and second differential transmission circuits 1, 1' is coupled to the first reference node (Q1), has an input terminal 101, 101' and an output terminal 102, 102', and includes first and second capacitive elements 11, 12, a first inductor 13, a third capacitive element 14 and a second inductor 15. In this embodiment, the input terminals 101, 101' of the first and second differential transmission circuits 1, 1' are used to respectively receive a positive phase input signal (Vin+) and a negative phase input signal (Vin−), which constitute a differential input signal pair. The output terminals 102, 102' of the first and second differential transmission circuits 1, 1' respectively output a positive phase output signal (Vout+) and a negative phase output signal (Vout−), which constitute a differential output signal pair corresponding to the differential input signal pair.

For each of the first and second differential transmission circuits 1, 1', the first and second capacitive elements 11, 12 are coupled in series between the input terminal 101, 101' and the output terminal 102, 102'. The first inductor 13 is coupled between the input terminal 101, 101' and the output terminal 102, 102'. The third capacitive element 14 and the second inductor 15 are coupled in series between the first reference node (Q1) and a first common node (Q2) between the first and second capacitive elements 11, 12. In this embodiment, for each of the first and second differential transmission circuits 1, 1', the first and second capacitive elements 11, 12 are coupled respectively to the input terminal 101, 101' and the output terminal 102, 102', and the third capacitive element 14 and the second inductor 15 are coupled respectively to the first common node (Q2) and the first reference node (Q1).

Figure 6:
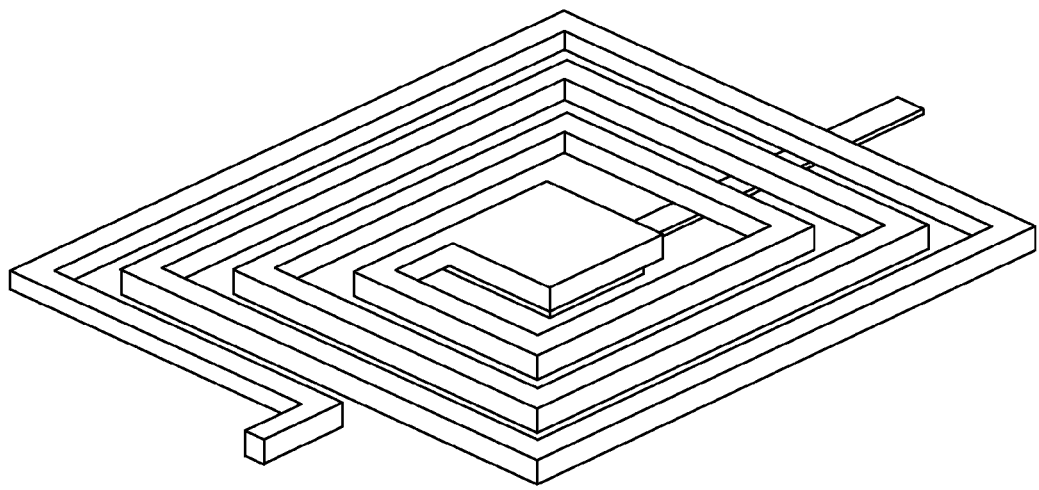
FIGS. 6 and 7 are perspective views showing different exemplary structures of inductors of the first preferred embodiment.
Figure 7:
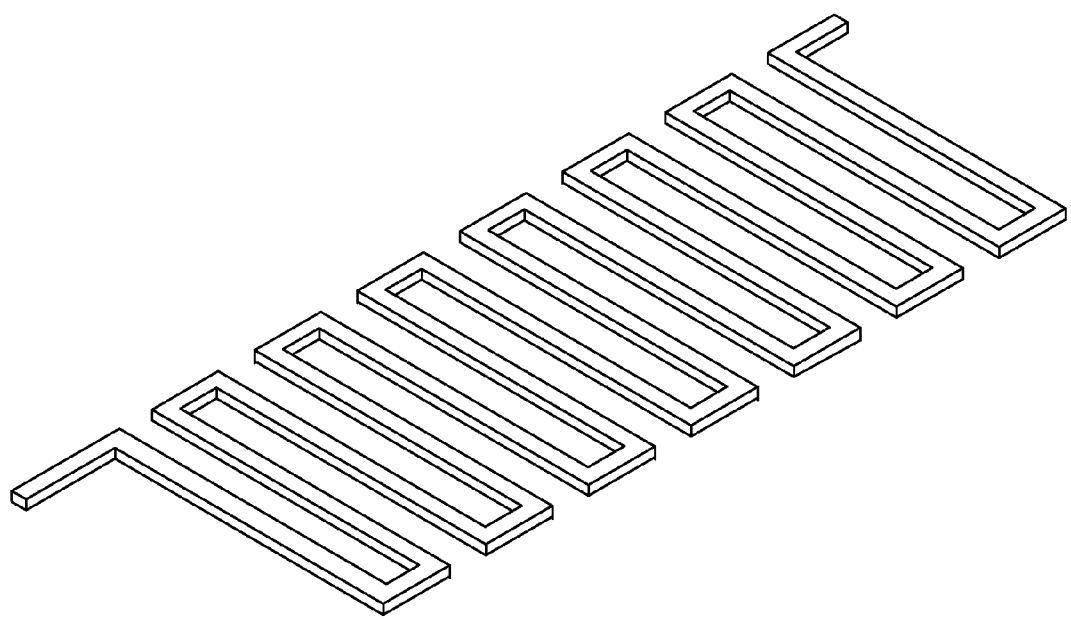
Figure 8:
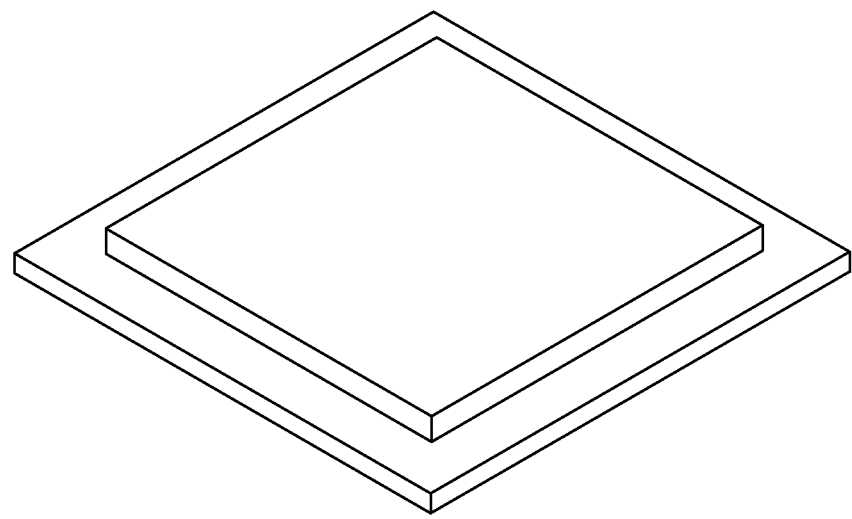
FIG. 8 is a perspective view showing an exemplary structure of capacitors of the first preferred embodiment.

Additionally, each of the first, second and third capacitive elements 11, 12, 14 includes, but is not limited to, a capacitor 111, 121, 141. It should be noted that the capacitors 111, 121 have the same capacitance that differs from that of the capacitor 141. On the other hand, each of the capacitors 111, 121, 141 may be a planar capacitor, as shown in FIG. 8, and the first and second inductors 13, 15 may have a spiral structure shown in FIG. 6, or a meandering structure shown in FIG. 7.

Figure 1A:
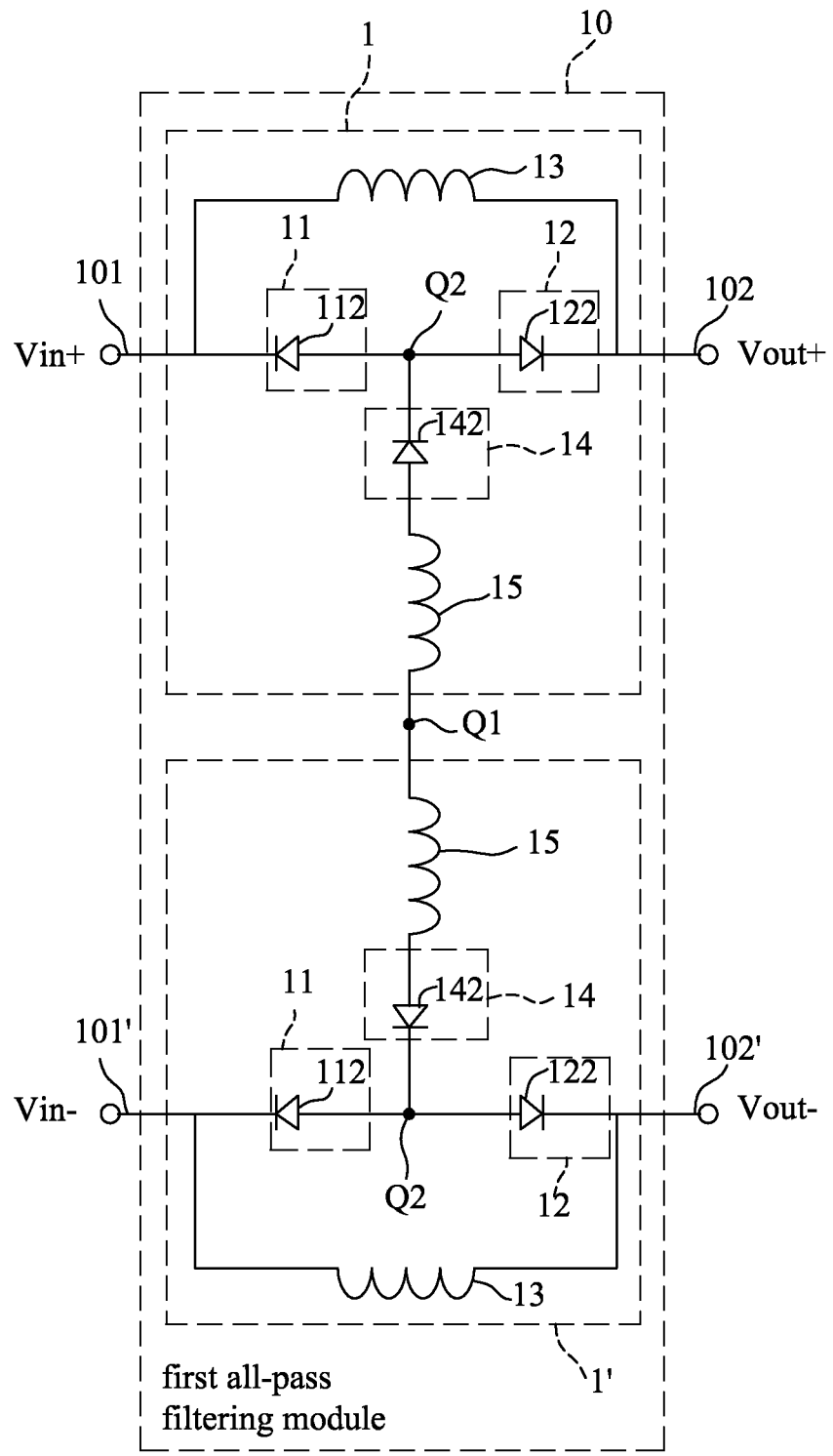
FIG. 1A is a schematic electrical circuit diagram illustrating a first variation of the first preferred embodiment.

FIG. 1A illustrates a first variation of the first preferred embodiment. Unlike the implementation shown in FIG. 1, each of the first, second and third capacitive elements 11, 12, 14 includes a diode 112, 122, 142. For each of the first and second differential transmission circuits 1, 1', cathode and anode of the diode 112 of the first capacitive element 11 are coupled respectively to the input terminal 101, 101' and the first common node (Q2), cathode and anode of the diode 122 of the second capacitive element 12 are coupled respectively to the output terminal 102, 102' and the first common node (Q2), and cathode and anode of the diode 142 of the third capacitive element 14 are coupled respectively to the first common node (Q2) and the second inductor 15.

Figure 1B:
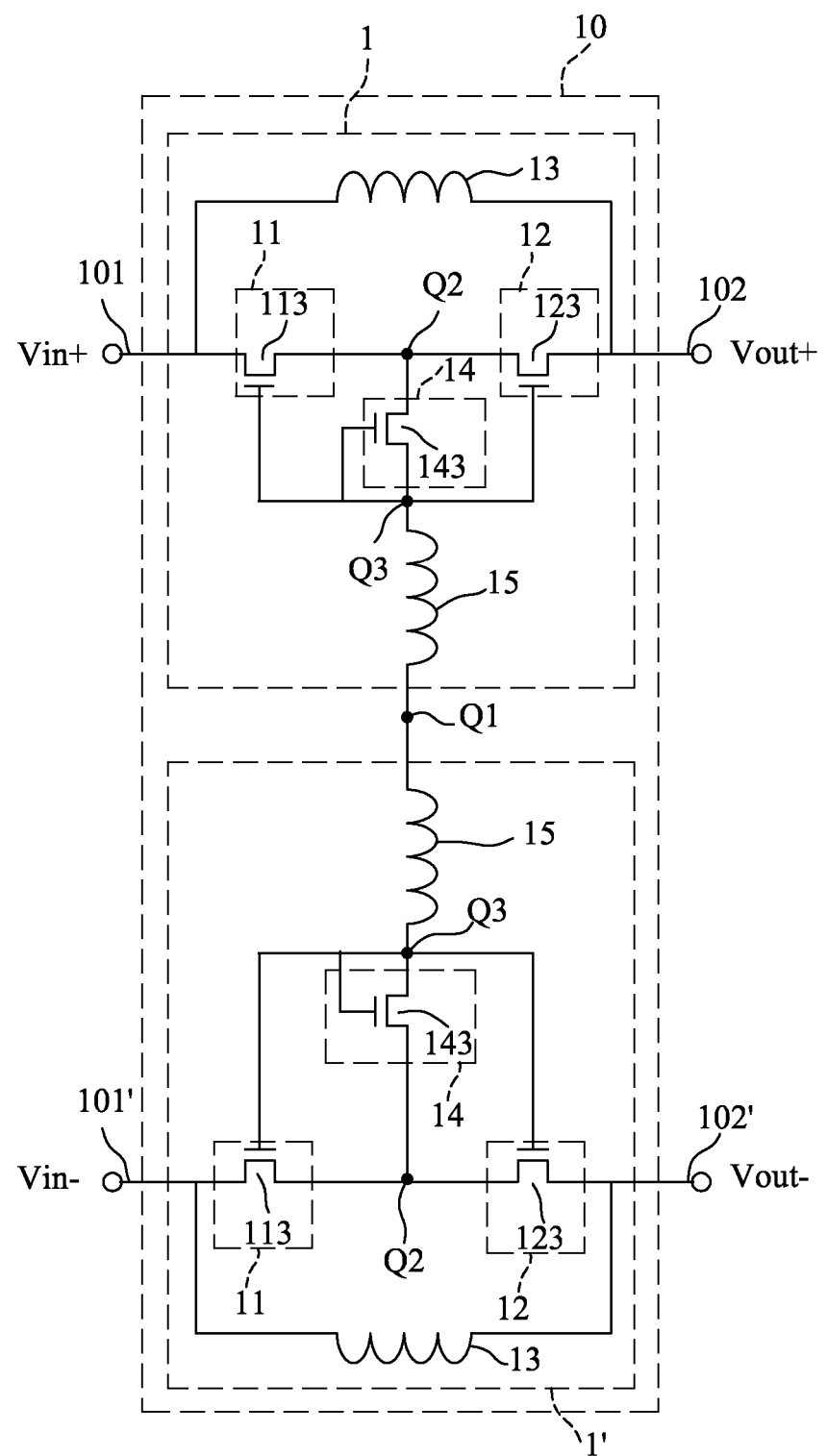
FIG. 1B is a schematic electrical circuit diagram illustrating a second variation of the first preferred embodiment.

FIG. 1B illustrates a second variation of the first preferred embodiment. Herein, for each of the first and second differential transmission circuits 1, 1', each of the first, second and third capacitive elements 11, 12, 14 includes a transistor 113, 123, 143 that has a first terminal, a second terminal, and a control terminal, which is coupled to a second common node (Q3) between the third capacitive element 14 and the second inductor 15. The first terminals of the transistors 113, 123 of the first and second capacitive elements 11, 12 are coupled respectively to the input terminal 101, 101' and the first common node (Q2), the second terminals of the transistors 113, 123 of the first and second capacitive elements 11, 12 are coupled respectively to the first common node (Q2) and the output terminal 102, 102', and the first and second terminals of the transistor 143 of the third capacitive element 14 are coupled respectively to the first and second common nodes (Q2, Q3). In this embodiment, each of the transistors 113, 123, 143 is an N-type MOSFET, which has drain, source and gate serving respectively as the first, second, and control terminals thereof.

In such a configuration, the common mode noise suppressing device of this invention may achieve parallel resonance so as to generate a high impedance for a common mode noise signal occurred in the common mode noise suppressing device at a resonant frequency, which is indicated by $\omega 1$, where $\omega 1 = 1/\sqrt{LC/2}$, L is an inductance of the first inductor 13 and C is a capacitance of the first capacitive element 11, thereby suppressing the common mode noise signal.

Figure 1C:
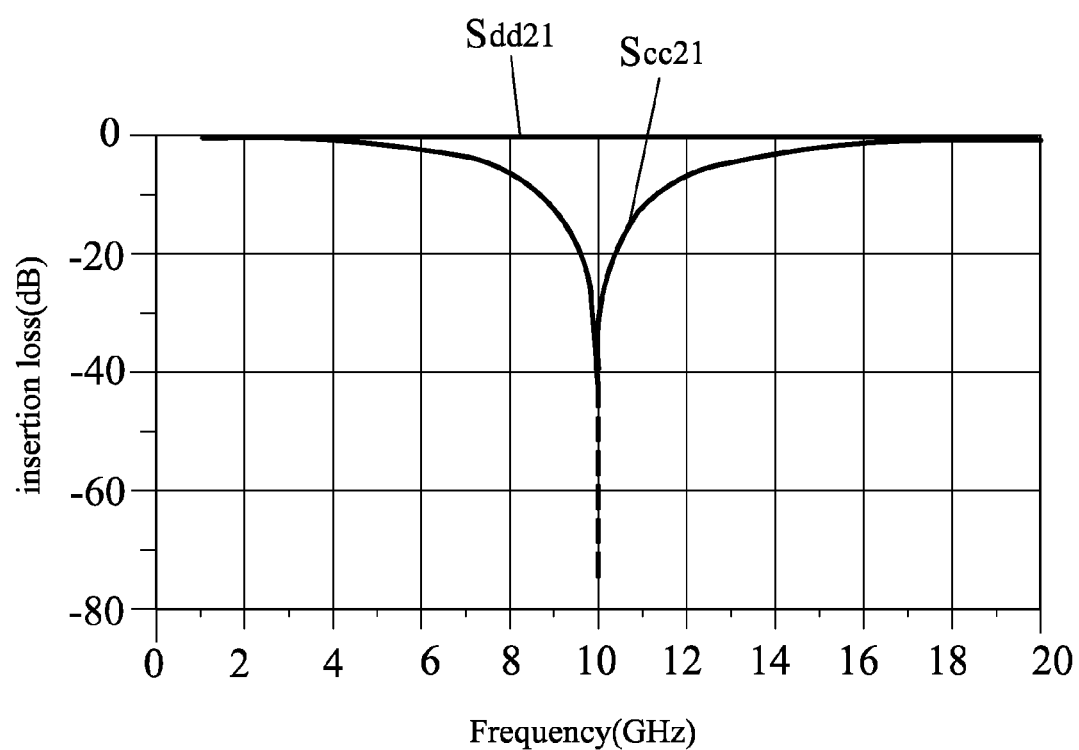
FIG. 1C is an exemplary simulation plot illustrating insertion loss versus frequency for a differential input signal pair and a common mode noise signal according to the first preferred embodiment.

FIG. 1C illustrates exemplary simulation results of insertion loss versus frequency for the differential input signal pair, indicated by $S_{dd21}$, and the common mode noise signal, indicated by $S_{cc21}$, according to the first preferred embodiment. From the exemplary simulation results of FIG. 1C, the differential input signal pair can be normally transmitted via the common mode noise suppressing device of this invention without any loss, whereas the common mode noise signal can be suppressed by the common mode noise suppressing device of this invention.

Figure 2:
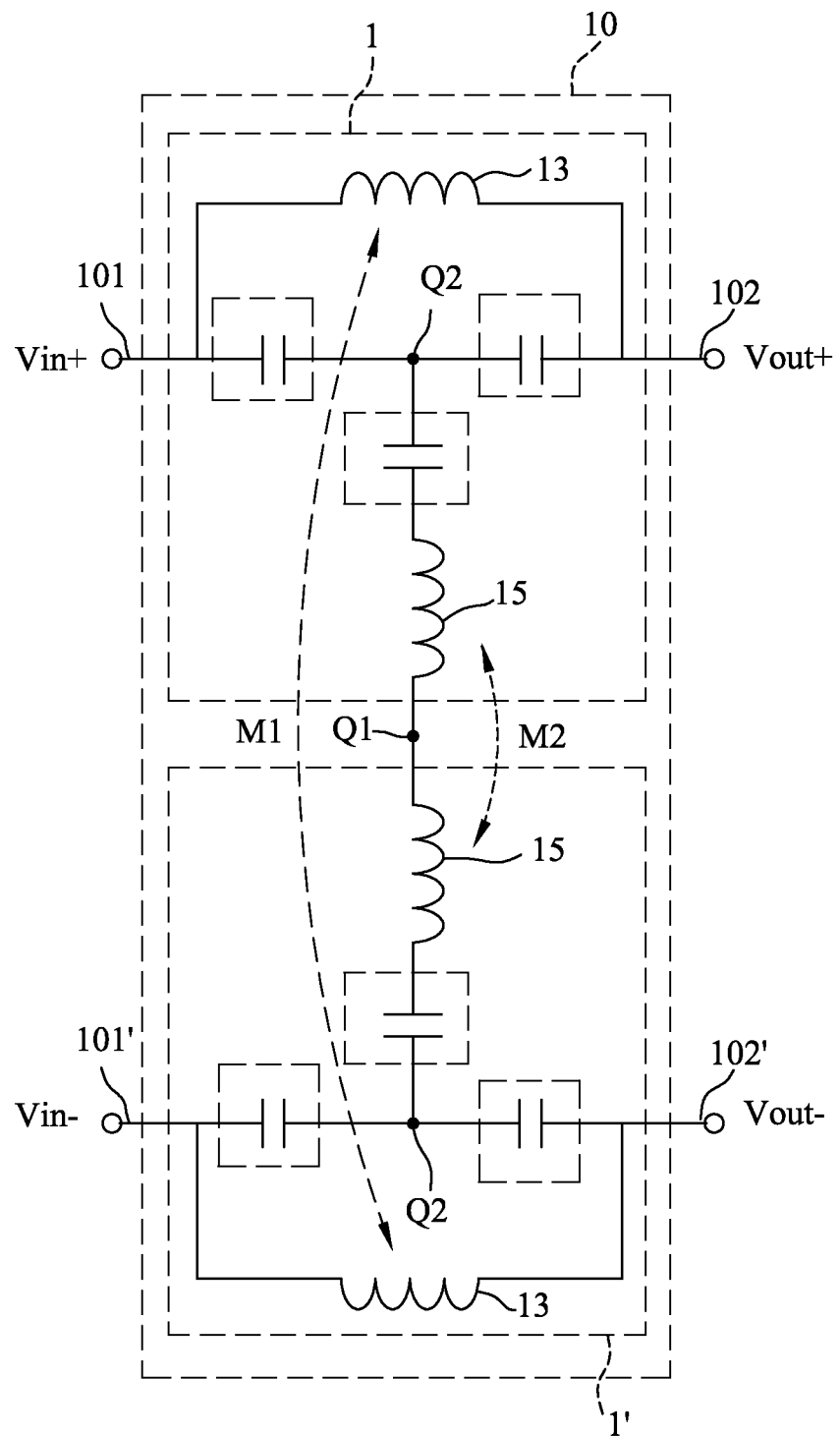
FIG. 2 is a schematic electrical circuit diagram illustrating the second preferred embodiment of a common mode noise suppressing device according to the present invention.

FIG. 2 illustrates the second preferred embodiment of the common mode noise suppressing device according to the present invention, which is similar to the first preferred embodiment. The second preferred embodiment differs from the first preferred embodiment of FIG. 1 in that, for the first and second differential transmission circuits 1, 1', the first inductors 13 are electromagnetically coupled with each other while the second inductors 15 are electromagnetically coupled with each other. In other embodiments, it may be that only the first inductors 13 are electromagnetically coupled with each other, or that only the second inductors 15 are electromagnetically coupled with each other.

In such a configuration, the common mode noise suppressing device of this invention may also achieve parallel resonance so as to generate a high impedance for a common mode noise signal occurred in the common mode noise suppressing device at a resonant frequency, which is indicated by $\omega 2$, where $\omega 2 = 1/\sqrt{(L+M1)C/2}$, L is the inductance of the first inductor 13, C is the capacitance of the first capacitive element 11, and M1 is a mutual inductance generated by the electromagnetically coupled first inductors 13, thereby suppressing the common mode noise signal.

It should be noted that, compared to the resonant frequency ($\omega 1$) of the first preferred embodiment that is anti-correlated with the inductance (L) of the first inductor 13 and the capacitance (C) of the first capacitive element 11, the resonant frequency ($\omega 2$) is anti-correlated with the inductance (L) of the first inductor 13, the capacitance (C) of the first capacitive element 11 and the mutual inductance (M1) of the electromagnetically coupled first inductors 13. Therefore, when the resonant frequency ($\omega 2$) is intended to be identical to the resonant frequency ($\omega 1$), the inductance (L) of the first inductor 13 and/or the capacitance (C) of the first capacitive element 11 required in the second preferred embodiment may be smaller than those/that of the first preferred embodiment by increasing the mutual inductance (M1). As a result, the common mode noise suppressing device of the second preferred embodiment has a decreased circuit area compared to the common mode noise suppressing device of the first preferred embodiment.

Figure 2A:
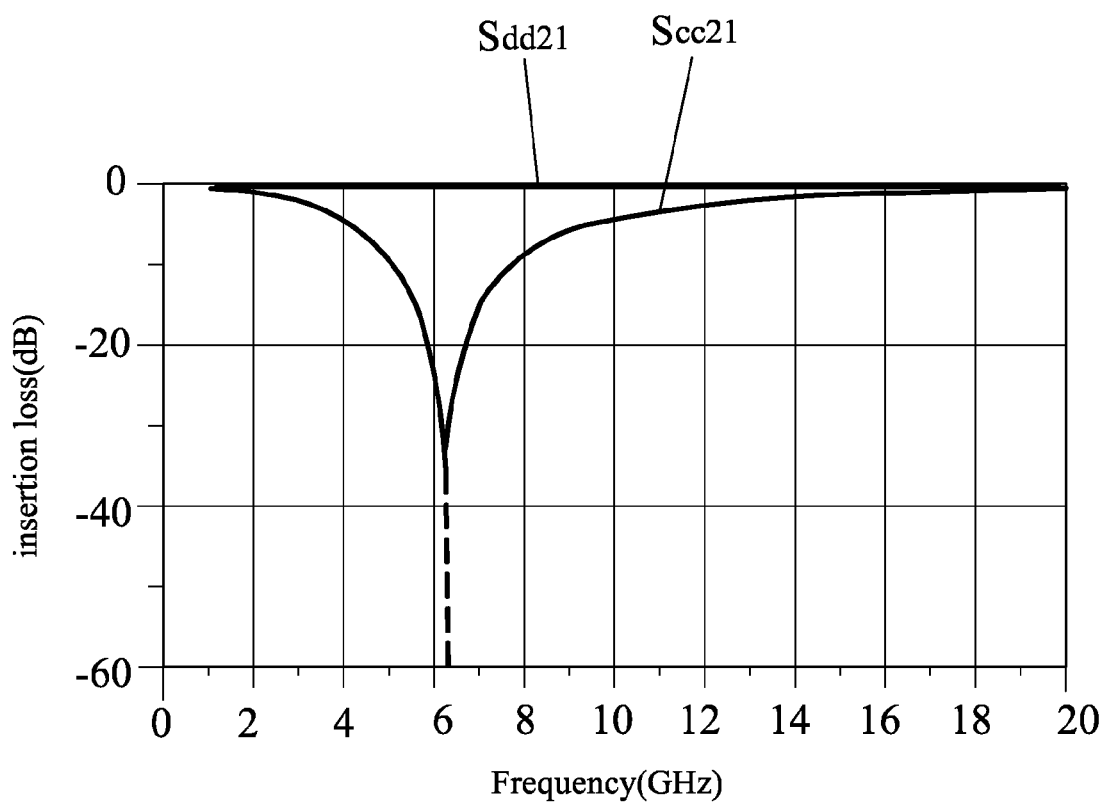
FIG. 2A is an exemplary simulation plot illustrating insertion loss versus frequency for a differential input signal pair and a common mode noise signal according to the second preferred embodiment.

FIG. 2A illustrates exemplary simulation results of the insertion losses ($S_{dd21}$, $S_{cc21}$) of the differential input signal pair and the common mode noise signal according to the second preferred embodiment. From the exemplary simulation results of FIG. 2A, the differential input signal pair can be normally transmitted via the common mode noise suppressing device of this invention without any loss, whereas the common mode noise signal can be suppressed by the common mode noise suppressing device of this invention.

Figure 3:
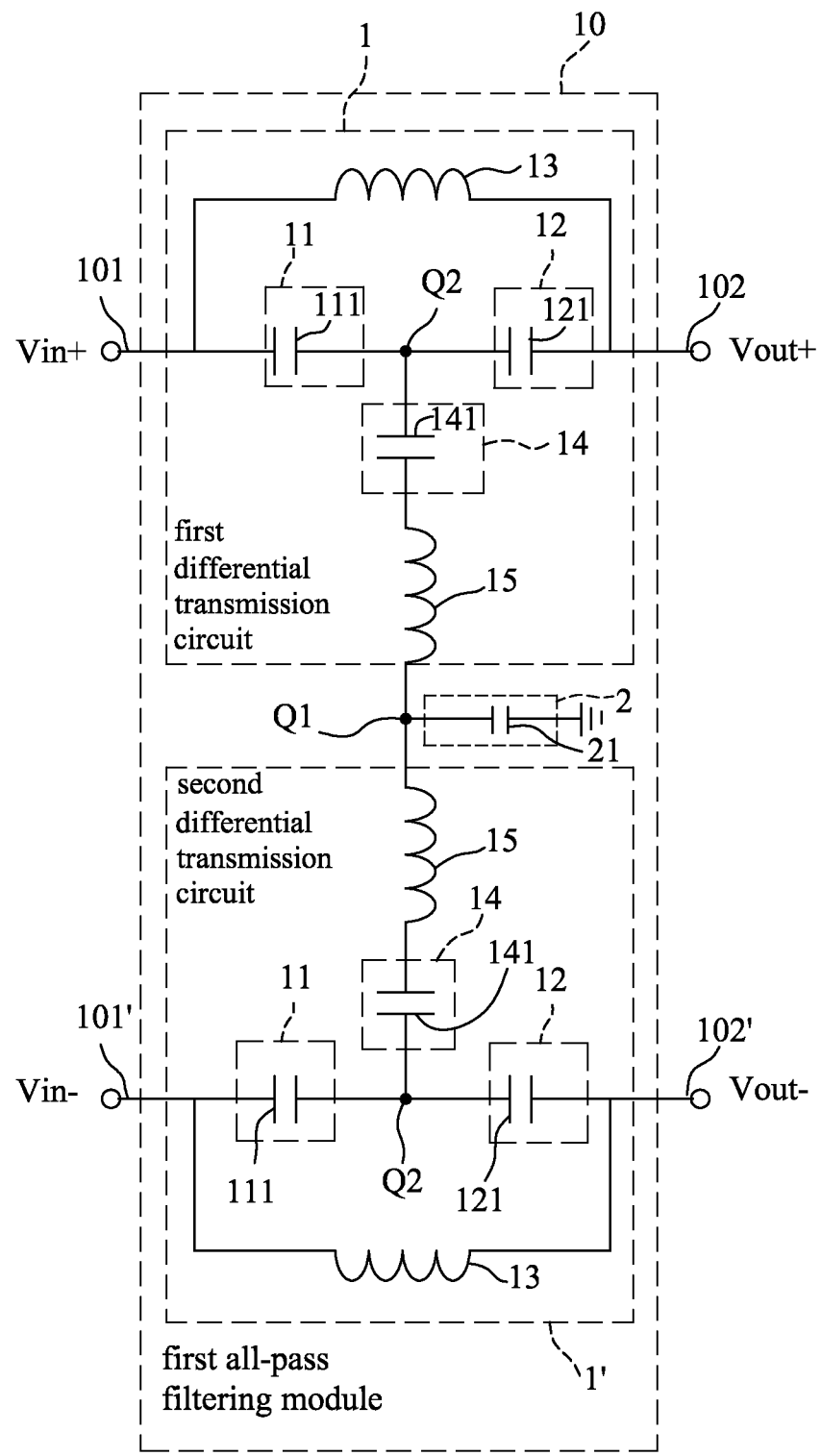
FIG. 3 is a schematic electrical circuit diagram illustrating the third preferred embodiment of a common mode noise suppressing device according to the present invention.

FIG. 3 illustrates the third preferred embodiment of the common mode noise suppressing device according to the present invention, which is a modification of the first preferred embodiment. Unlike the first preferred embodiment, the first all-pass filtering module 10 further includes a first noise suppression circuit 2 that is coupled to the first reference node (Q1).

In this embodiment, the first noise suppression circuit 2 includes, but is not limited to, a capacitor 21 that is coupled between the first reference node (Q1) and ground. In other embodiments, the first noise suppression circuit 2 may include one of a switch, a resistor, an inductor, a diode, a transistor and a silicon rectifier or a combination thereof.

In such a configuration, since the first noise suppression circuit 2 is connected to ground, the common mode noise suppressing device of this invention may achieve series resonance so as to form a low impedance for a common mode noise signal occurred in the common mode noise suppressing device. Thus the common mode noise signal is guided to the ground through the first noise suppression circuit 2, thereby effectively suppressing the common mode noise signal. It should be noted that, since the differential input signal pair does not pass through the first noise suppression circuit 2, the addition of the first noise suppression circuit 2 does not affect the differential input signal pair.

Figure 3A:
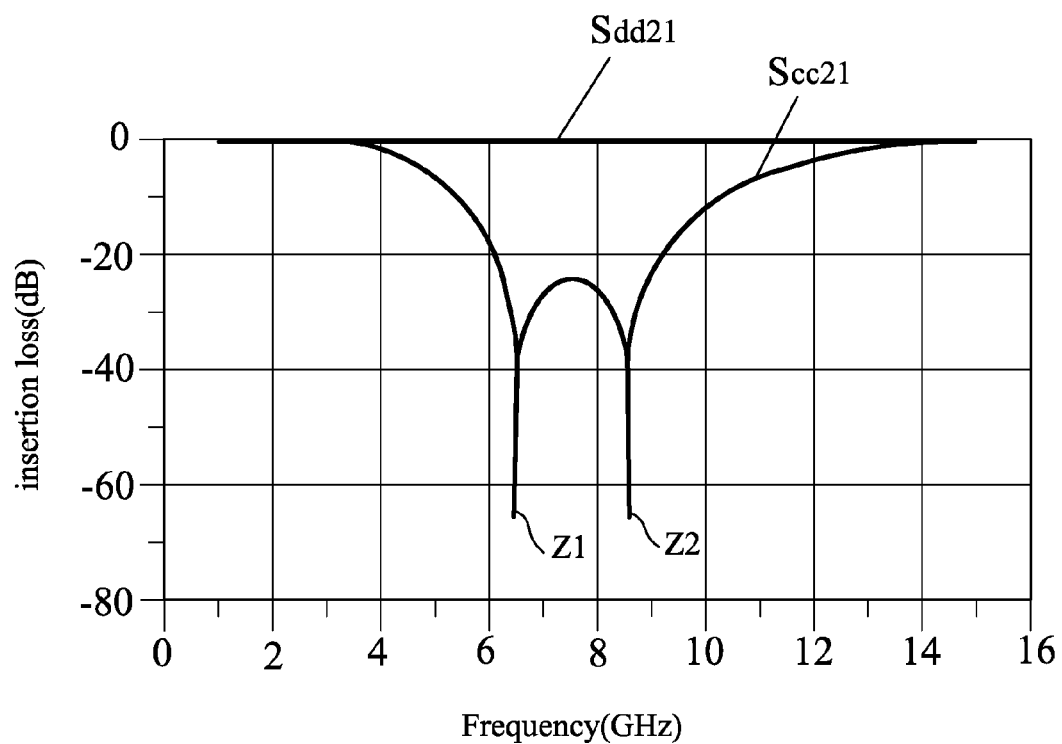
FIG. 3A is an exemplary simulation plot illustrating insertion loss versus frequency for a differential input signal pair and a common mode noise signal according to the third preferred embodiment.

FIG. 3A illustrates exemplary simulation results of the insertion losses ($S_{dd21}$, $S_{cc21}$) of the differential input signal pair and the common mode noise signal according to the third preferred embodiment. From the exemplary simulation results of FIG. 3A, the differential input signal pair is not affected by the first noise suppression circuit 2, and can be normally transmitted via the common mode noise suppressing device of this invention. In addition, the common mode noise signal can be suppressed at two resonant frequencies (Z1, Z2) of the common mode noise suppressing device as expressed by the following equations:

$$Z1 = \sqrt{\frac{B + \sqrt{B^2 - 4C}}{2}}, Z2 = \sqrt{\frac{B - \sqrt{B^2 - 4C}}{2}}$$

$$B = \frac{4L_{15}C' - L_{13}C' + L_{13}C_{111}}{2L_{13}L_{15}C_{111}C'}, C = \frac{1}{L_{13}L_{15}C_{111}C'},$$

$$C' = \frac{1}{\frac{1}{C_{111}} + \frac{2}{C_{141}} + \frac{2}{C_{21}}}$$

where $L_{15}$ is an inductance of the second inductor 15, $L_{13}$ is an inductance of the first inductor 13, $C_{111}$ is a capacitance of the first capacitive element 11, $C_{141}$ is capacitance of the third capacitive element 14, and $C_{21}$ is a capacitance of the capacitor 21.

Figure 3B:
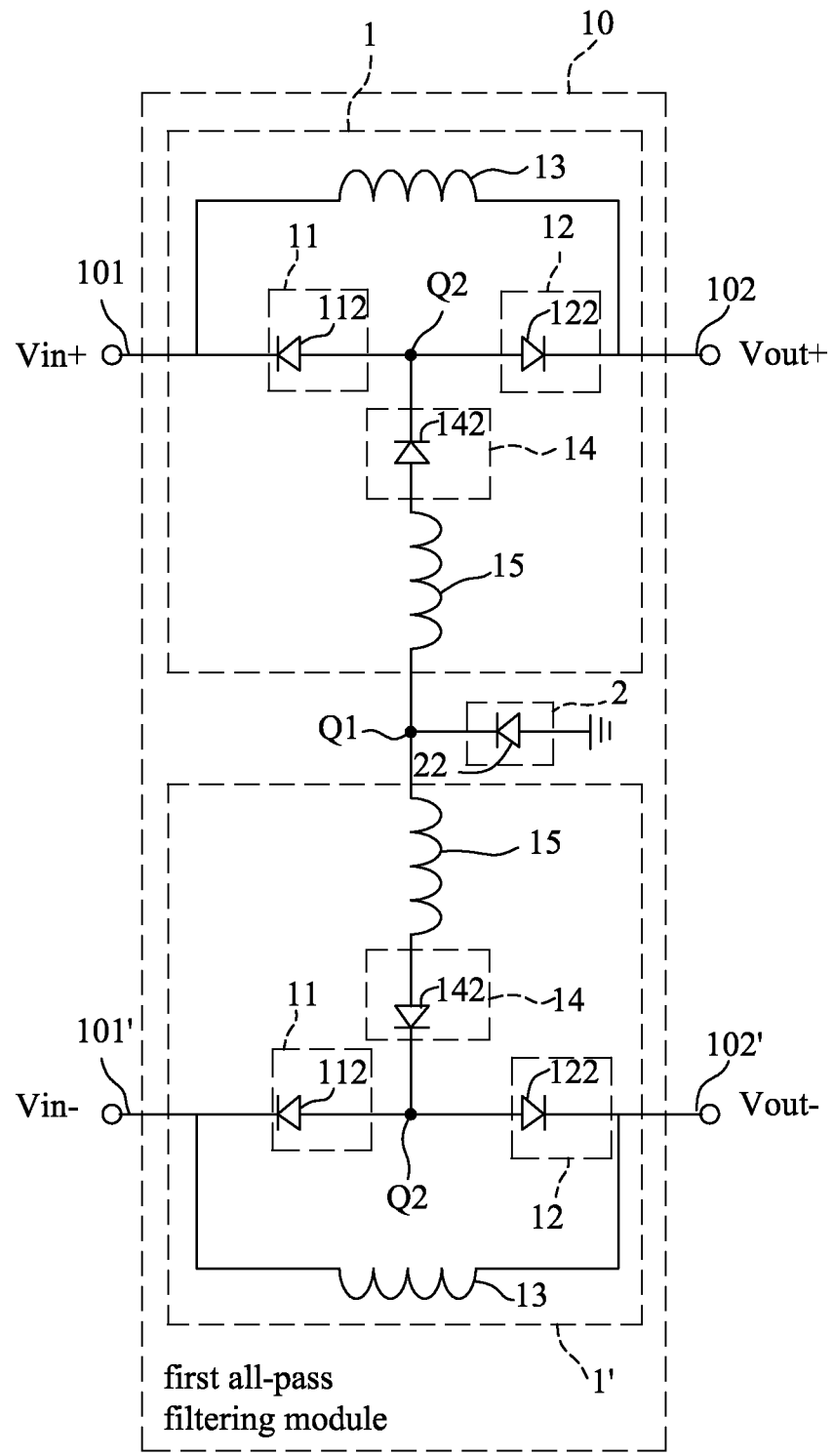
FIG. 3B is a schematic electrical circuit diagram illustrating a first variation of the third preferred embodiment.

FIG. 3B illustrates a first variation of the third preferred embodiment. In this variation, the first and second differential transmission circuits 1, 1' have the same configuration as the first and second differential transmission circuits 1, 1' of FIG. 1A. In addition, instead of the capacitor 21, the first noise suppression circuit 2 includes a diode 22 whose cathode and anode are coupled respectively to the first reference node (Q1) and ground. It should be noted that, when the diodes 112, 142 of each of the first and second differential transmission circuits 1, 1' and the diode 22 of the second noise suppression circuit 2 conduct, the diodes 112, 142 and the second inductor 15 of the first differential transmission circuit 1 and the diode 22 constitute a static electricity dissipation path, and the diodes 112, 142 and the second inductor 15 of the second differential transmission circuit 1' and the diode 22 constitute another static electricity dissipation path.

Figure 3C:
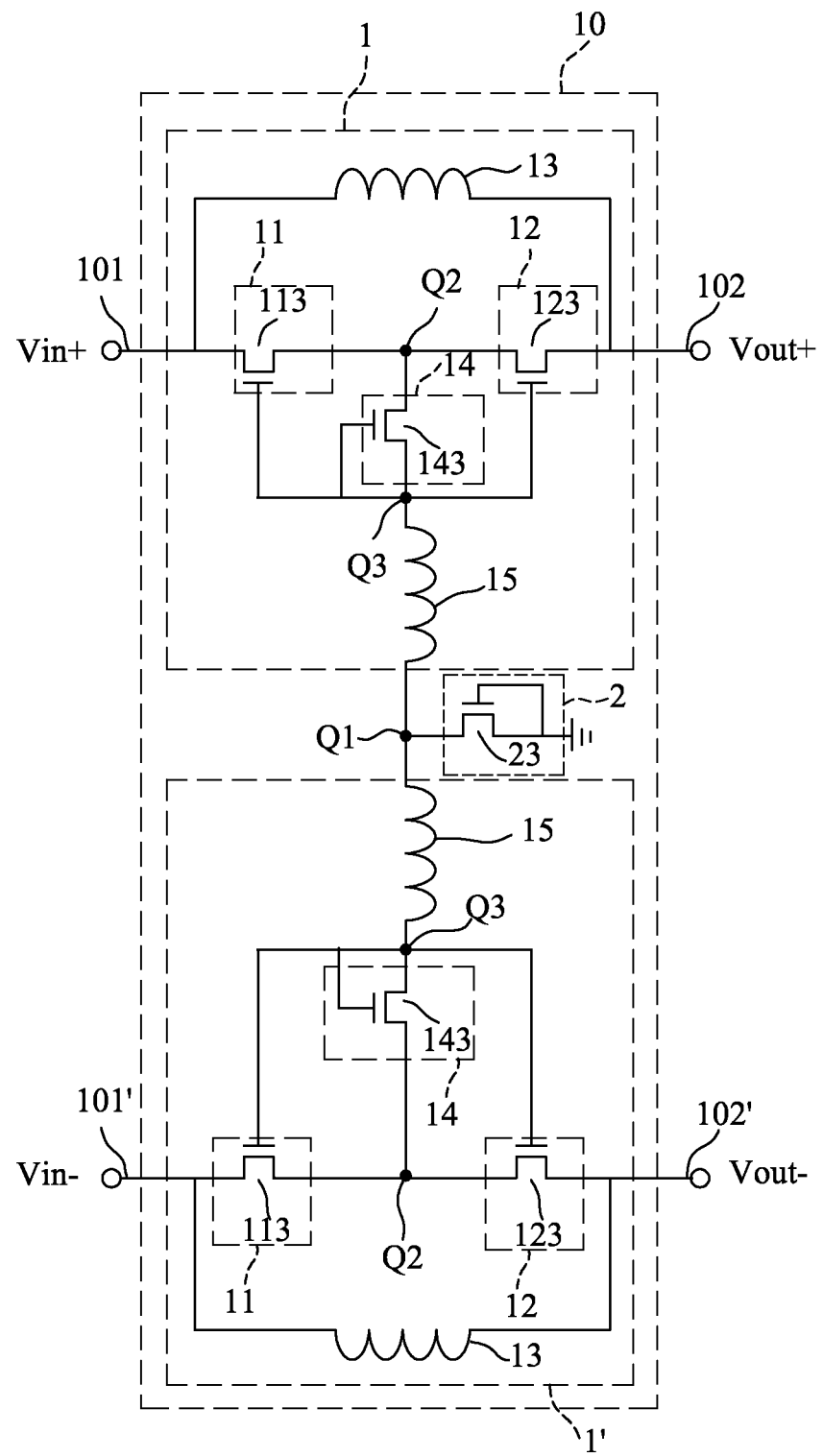
FIG. 3C is a schematic electrical circuit diagram illustrating a second variation of the third preferred embodiment.

FIG. 3C illustrates a second variation of the third preferred embodiment. In this variation, the first and second differential transmission circuits 1, 1' have the same configuration as the first and second differential transmission circuits 1, 1' of FIG. 1B. In addition, the first noise suppression circuit 2 includes, in place of the capacitor 21, a transistor 23, which has first and second terminals coupled respectively to the first reference node (Q1) and ground, and a grounded control terminal. It should be noted that, when the transistors 113, 143 of each of the first and second differential transmission circuits 1, 1' and the transistor 23 of the first noise suppression circuit 2 conduct, the transistors 113, 143 and the second inductor 15 of the first differential transmission circuit 1 and the transistor 23 constitute a static electricity dissipation path, and the transistors 113, 143 and the second inductor 15 of the second differential transmission circuit 1' and the transistor 23 constitute another static electricity dissipation path.

Figure 4:
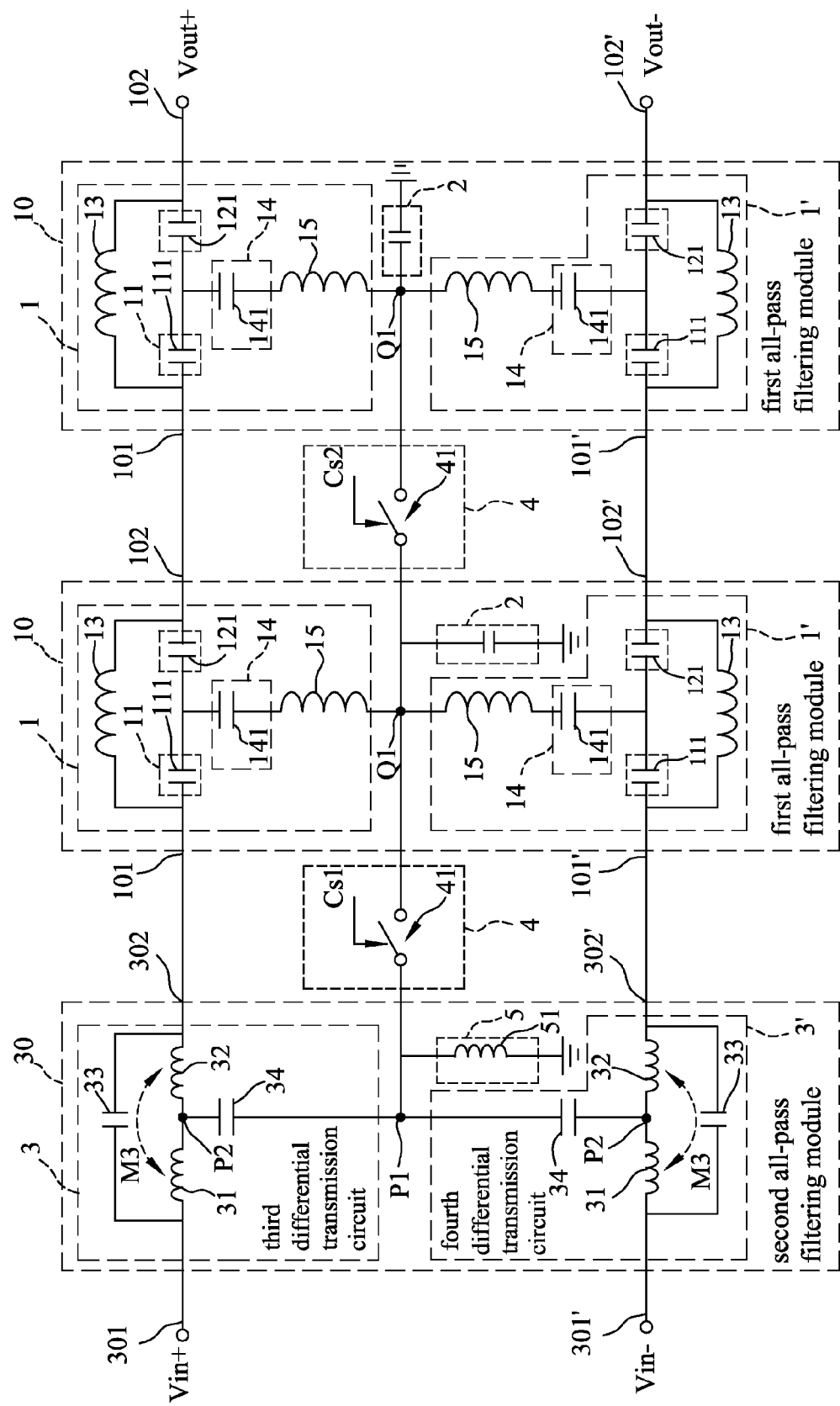
FIG. 4 is a schematic electrically circuit diagram illustrating the fourth preferred embodiment of a common mode noise suppressing device according to the present invention.

Referring to FIG. 4, the fourth preferred embodiment of a common mode noise suppressing device according to the present invention is shown to include a number J of the first all-pass filtering modules 10, a number K of second all-pass filtering modules 30, and a number L of second noise suppression circuits 4, where J≥1, K≥1, L=J+K−1. In this embodiment, J=2, K=1, and L=2.

In this embodiment, the second all-pass filtering module 30 includes a second reference node (P1), third and fourth differential transmission circuits 3, 3' and a third noise suppression circuit 5.

Each of the third and fourth differential transmission circuits 3, 3' is coupled to the second reference node (P1), has an input terminal 301, 301' and an output terminal 302, 302', and includes series coupled third and fourth inductors 31, 32, and first and second capacitor 33, 34. The input terminals 301, 301' of the third and fourth differential transmission circuits 3, 3' are used to respectively receive a positive phase input signal (Vin+) and a negative phase input signal (Vin−), which constitute a differential input signal pair. For each of the third and fourth differential transmission circuits 3, 3', the third and fourth inductors 31, 32 are coupled respectively to the input terminal 301, 301' and the output terminal 302, 302', and are electromagnetically coupled with each other. The first capacitor 33 is coupled between the input terminal 301, 301' and the output terminal 302, 302'. The second capacitor 34 is coupled between the second reference node (P1) and a second common node (P2) between the third and fourth inductors 31, 32.

The third noise suppression circuit 5 is coupled to the second reference node (P1). In this embodiment, the third noise suppression circuit 5 includes, but is not limited to, an inductor 51 that is coupled between the second reference node (P1) and ground. In other embodiments, the third noise suppression circuit 5 may include one of a switch, a resistor, a capacitor, a diode, a transistor and a silicon rectifier or a combination thereof.

In this embodiment, each first all-pass filtering module 10 has the same configuration as the first all-pass filtering module 10 of FIG. 3. The third differential transmission circuit 3 of the second all-pass filtering module 30 and the first differential transmission circuits 1 of the first all-pass filtering modules 10 are coupled in series with each other. The fourth differential transmission circuit 3' of the second all-pass filtering module 30 and the second differential transmission circuits 1' of the first all-pass filtering modules 10 are coupled in series with each other. In this embodiment, the output terminals 102, 102' of the first and second differential transmission circuits 1, 1' of one of the first all-pass filtering modules 10, i.e., the rightmost first all-pass filtering module 10 in FIG. 4, respectively output a positive phase output signal (Vout+) and a negative phase output signal (Vout−), which constitute a differential output signal pair. It should be noted that, in this embodiment, the first inductors 13 of different first all-pass filtering modules 10 have different inductances, the second inductors 15 of different first all-pass filtering modules 10 have different inductances, the first capacitive elements 11 of different first all-pass filtering modules 10 have different capacitances, the second capacitive elements 12 of different first all-pass filtering modules 10 have different capacitances, and the third capacitive elements 14 of different first all-pass filtering modules 10 have different capacitances. However, in other embodiments, the first inductors 13 of the first all-pass filtering modules 10 may have the same inductance, the second inductors 15 of the first all-pass filtering modules 10 may have the same inductance, the first capacitive elements 11 of the first all-pass filtering modules 10 may have the same capacitance, the second capacitive elements 12 of the first all-pass filtering modules 10 may have the same capacitance and the third capacitive elements 14 of the first all-pass filtering modules 10 may have the same capacitance.

Each of the second noise suppression circuits 4 is coupled between corresponding two adjacent ones of the first and second all-pass filtering modules 10, 30. In this embodiment, one second noise suppression circuit 4 is coupled between the second reference node (P1) of the second all-pass filtering module 30 and the first reference node (Q1) of an adjacent one of the first all-pass filtering modules 10. The other second noise suppression circuit 4 is coupled between the first reference nodes (Q1) of the first all-pass filtering modules 10 adjacent to each other. In this embodiment, each of the second noise suppression circuits 4 includes a switch 41, which is operable to be conducting or non-conducting in response to a control signal (Cs1, Cs2) received thereby, so as to adjust a frequency band in which the common mode noise is suppressed. However, in other embodiments, each second noise suppression circuit 4 may include one of a resistor, a capacitor, a diode, a transistor and an inductor or a combination thereof.

Figure 4A:
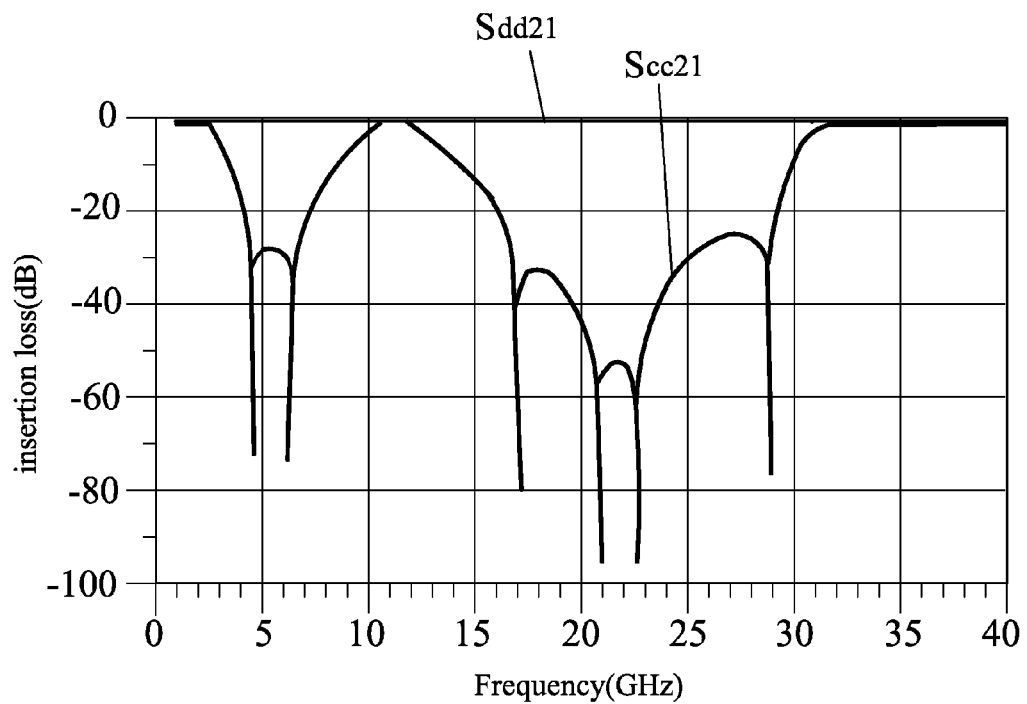
FIG. 4A is an exemplary simulation plot illustrating insertion loss versus frequency for a differential input signal pair and a common mode noise signal according to the fourth preferred embodiment.

FIG. 4A illustrates exemplary simulation results of insertion losses ($S_{dd21}$, $S_{cc21}$) of the differential input signal pair and the common mode noise signal according to the fourth preferred embodiment. From the exemplary simulation results of FIG. 4A, the differential input signal pair can be normally transmitted via the common mode noise suppressing device of this invention without any loss, whereas the common mode noise signal can be suppressed at different resonant frequencies.

Figure 4B:
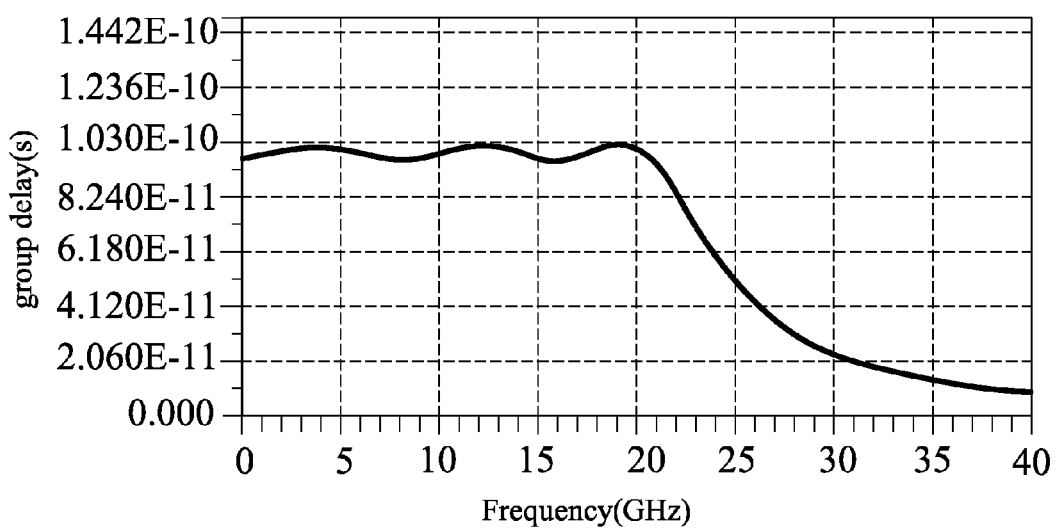
FIG. 4B is an exemplary simulation plot illustrating group delay versus frequency for the differential input signal pair according to the fourth preferred embodiment.

In addition, in this embodiment, the common mode noise suppressing device has a group delay response that is correlated with the capacitance of the capacitors 141. Therefore, the group delay response can be changed by adjusting the capacitance of the third capacitive element 14. FIG. 4B illustrates an exemplary result of group delay of the differential input signal pair according to the fourth preferred embodiment. From the exemplary result of FIG. 4B, the common mode noise suppressing device has a relatively smooth group delay response which may be controlled more effectively to obtain a better eye diagram compared to the second all-pass filtering module 30 alone.

Figure 4C:
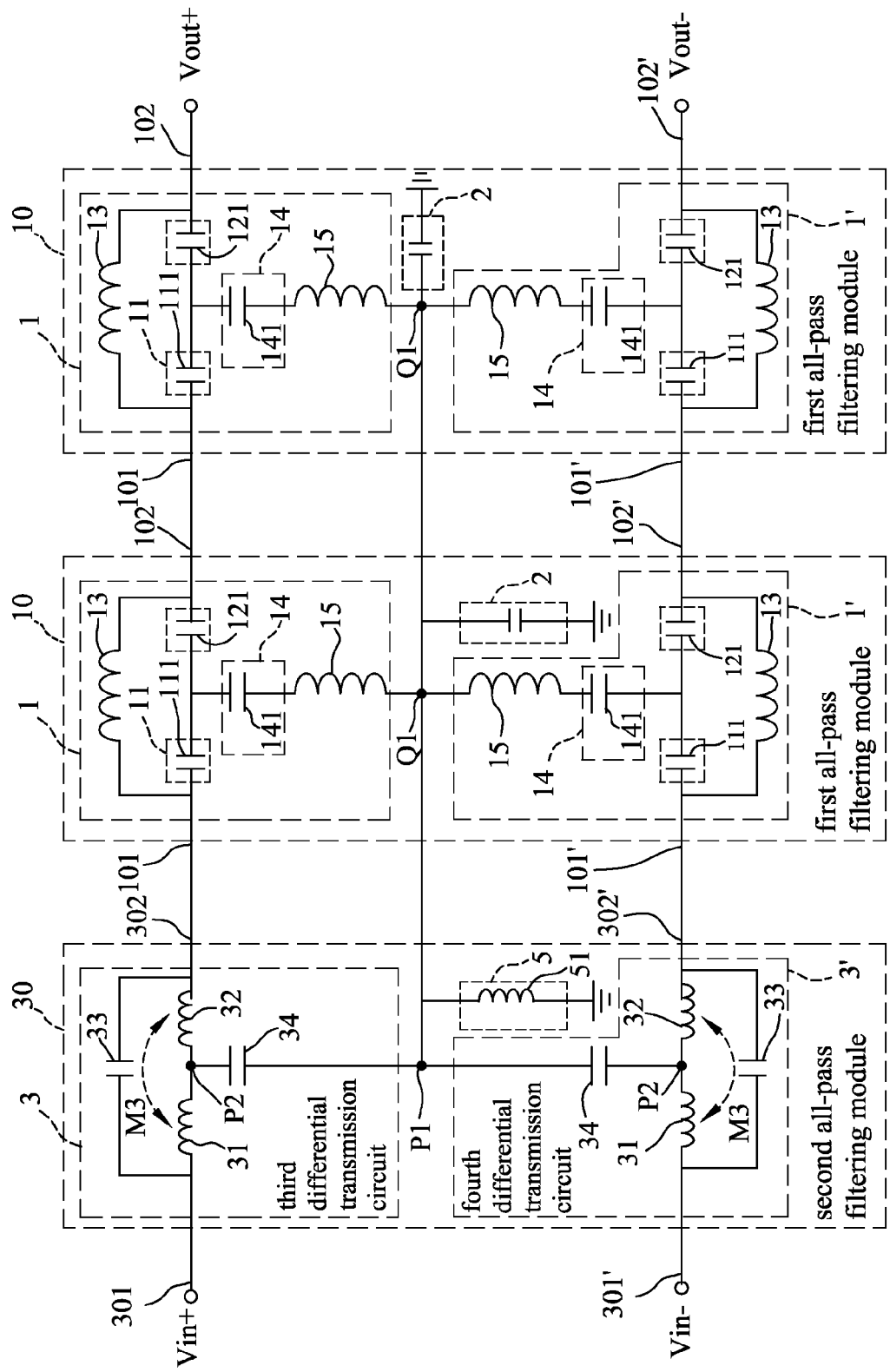
FIG. 4C is a schematic electrical circuit diagram illustrating an equivalent circuit of the fourth preferred embodiment.

FIG. 4C illustrates an equivalent circuit of the fourth preferred embodiment when the switches 41 (see FIG. 4) conduct, wherein the second reference node (P1) of the second all-pass filtering module 30 and the first reference nodes (Q1) of the first all-pass filtering modules 10 are coupled together.

Figure 5:
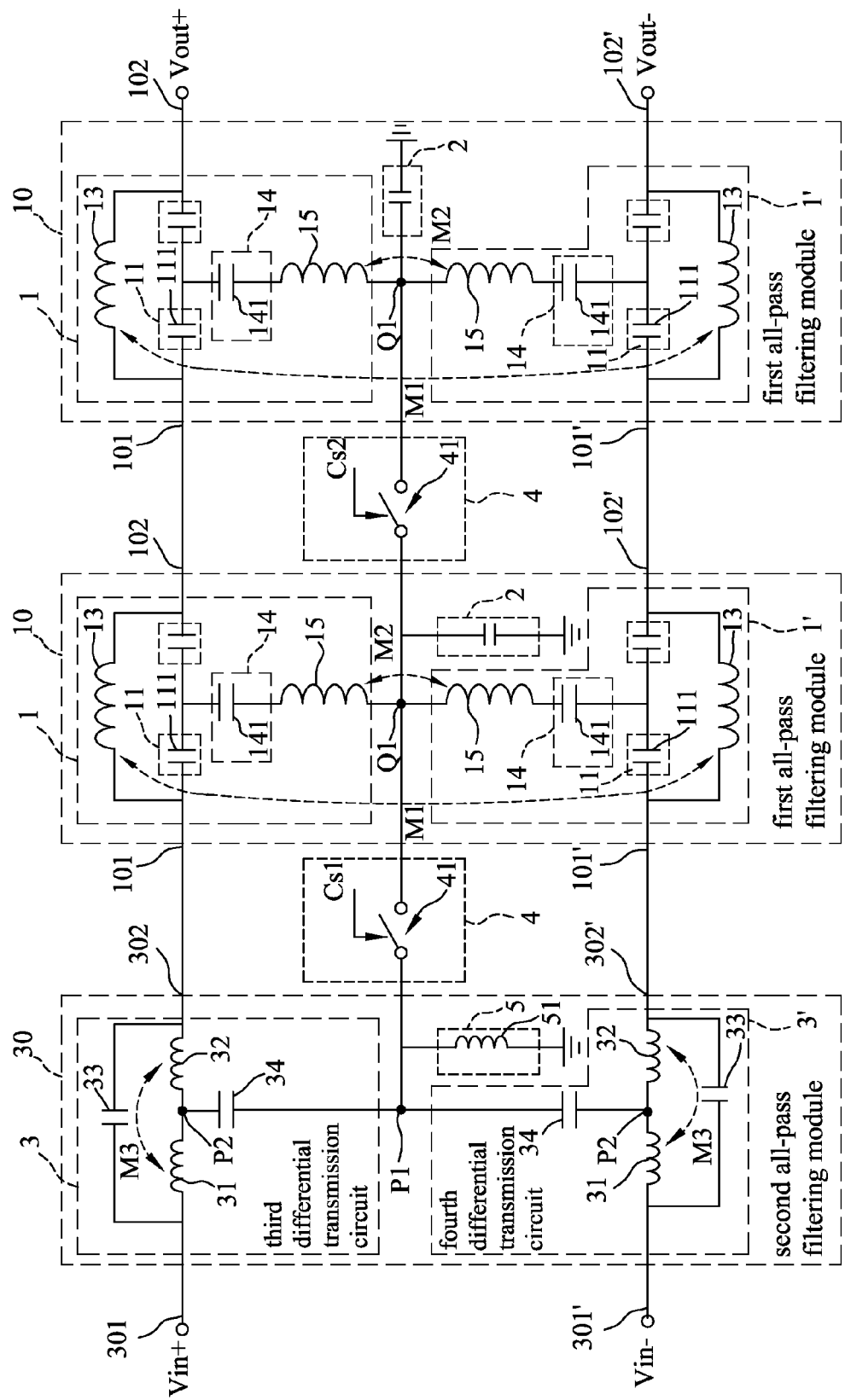
FIG. 5 is a schematic circuit diagram illustrating the fifth preferred embodiment of a common mode noise suppressing device according to the present invention.

FIG. 5 illustrates the fifth preferred embodiment of the common mode noise suppressing device according to the present invention, which is similar to the fourth preferred embodiment. Unlike the fourth preferred embodiment, for the first and second differential transmission circuits 1, 1' of each first all-pass filtering module 10, similar to the second preferred embodiment of FIG. 2, the first inductors 13 are electromagnetically coupled with each other while the second inductors 15 are electromagnetically coupled with each other. In other embodiments, it may be that only the first inductors 13 are electromagnetically coupled with each other, or that only the second inductors 15 are electromagnetically coupled with each other.

The following are some of the advantages attributed to the common mode noise suppressing device of the present invention:

1. The first and second inductors 13, 15 of each first all-pass filtering module 10 are not required to be electromagnetically coupled with each other. The capacitive elements 11, 12 of each first all-pass filtering module 10 are used to replace the electromagnetically coupled inductors used in the aforesaid conventional common mode noise suppressing device. Therefore, the common mode noise suppressing device of this invention can be easily designed as compared to the prior art.

2. Due to the presence of the first all-pass filtering module(s) 10, which is a kind of capacitive all-pass filtering module, the common mode noise suppressing device of this invention may have a larger operating frequency range as compared to the prior art.

3. In the case that the first inductors 13 of each first all-pass filtering module 10 are electromagnetically coupled with each other, the resonant frequency is anti-correlated with the inductance of each first inductor 13, the capacitance of each first capacitive element 11 and the mutual inductance of the electromagnetically coupled first inductors 13. Therefore, by increasing the mutual inductance, the capacitance of the first capacitive element 11 and/or the inductance of the first inductor 13 can be reduced, thereby decreasing the circuit area of the common mode noise suppressing device of this invention.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A common mode noise suppressing device comprising:
   at least one first all-pass filtering module including a first reference node, and a first differential transmission circuit and a second differential transmission circuit, each of which has an input terminal and an output terminal, and includes a first capacitive element and a second capacitive element coupled in series between said input terminal and said output terminal, a first inductor coupled between said input terminal and said output terminal, and an LC series circuit consisting of a third capacitive element and a second inductor that are coupled in series and that form a first terminal and a second terminal of said LC series circuit, said first terminal of said LC series circuit being coupled to a first common node of said first and second capacitive elements, said second terminal of said LC series circuit serving as said first reference node.

2. The common mode noise suppressing device of claim 1, satisfying at least one of the following conditions:

said first inductors of said first and second differential transmission circuits are electromagnetically coupled with each other; and said second inductors of said first and second differential transmission circuits are electromagnetically coupled with each other.

3. The common mode noise suppressing device of claim 1, for each of said first and second differential transmission circuits, said first and second capacitive elements are coupled respectively to said input and output terminals.

4. The common mode noise suppressing device of claim 3, wherein, for each of said first and second differential transmission circuits, each of said first, second and third capacitive elements includes a capacitor.

5. The common mode noise suppressing device of claim 3, wherein, for each of said first and second differential transmission circuits:

each of said first, second and third capacitive elements includes a diode; and said diode of said first capacitive element has a cathode and an anode that are coupled respectively to said input terminal and said first common node, said diode of said second capacitive element has a cathode and an anode that are coupled respectively to said output terminal and said first common node, and said diode of said third capacitive element has a cathode and an anode that are coupled respectively to said first common node and said second inductor.

6. The common mode noise suppressing device of claim 3, wherein, for each of said first and second differential transmission circuits, each of said first, second and third capacitive elements includes a transistor that has a first terminal, a second terminal, and a control terminal, which is coupled to a second common node of said third capacitive element and said second inductor.

7. The common mode noise suppressing device of claim 6, wherein, for each of said first and second differential transmission circuits, said first terminals of said transistors of said first and second capacitive elements are coupled respectively to said input terminal and said first common node, said second terminals of said transistors of said first and second capacitive elements are coupled respectively to said first common node and said output terminal, and said first and second terminals of said transistor of said third capacitive element are coupled respectively to said first and second common nodes.

8. The common mode noise suppressing device of claim 1, wherein said input terminals of said first and second differential transmission circuits are disposed to cooperatively receive a differential input signal pair, said output terminals of said first and second differential transmission circuits are disposed to cooperatively output a differential output signal pair.

9. The common mode noise suppressing device of claim 1, wherein said at least one first all-pass filtering module further includes a first noise suppression circuit that is coupled to said first reference node.

10. The common mode noise suppressing device of claim 9, wherein said common mode noise suppressing device comprises a number J of said at least one first all-pass filtering modules, where J≥1, said common mode noise suppressing device further comprising a number K of second all-pass filtering modules, where K≥1, each of said second all-pass filtering modules including:

a second reference node; and third and fourth differential transmission circuits coupled to said second reference node;

wherein said first differential transmission circuit(s) of said at least one first all-pass filtering module(s) and said third differential transmission circuit(s) of said second all-pass filtering module(s) are coupled in series with each other, and said second differential transmission circuit(s) of said at least one first all-pass filtering module(s) and said fourth differential transmission circuit(s) of said second all-pass filtering module(s) are coupled in series with each other.

11. The common mode noise suppressing device of claim 10, wherein said second reference node(s) of said second all-pass filtering module(s) and said first reference node(s) of said at least one first all-pass filtering module(s) are coupled together.

12. The common mode noise suppressing device of claim 10, further comprising:

a number L of second noise suppression circuits, where L=J+K−1;

wherein each of said second noise suppression circuit(s) is coupled between corresponding two adjacent ones of said first and second all-pass filtering modules.

13. The common mode noise suppressing device of claim 10, wherein:

one of said second all-pass filtering modules further includes a third noise suppression circuit coupled to said second reference node; and for each of said second all-pass filtering modules, each of said third and fourth differential transmission circuits has an input terminal and an output terminal, and includes third and fourth inductors coupled in series between said input terminal and said output terminal, a first capacitor coupled between said input terminal and said output terminal, and a second capacitor coupled between said second reference node and a second common node of said third and fourth inductors.

14. The common mode noise suppressing device of claim 13, wherein, for each of said second all-pass filtering modules, said third and fourth inductors of each of said third and fourth differential transmission circuits are electromagnetically coupled with each other.

15. The common mode noise suppressing device of claim 1, wherein said first inductor of each of the first and second differential transmission circuits has a first terminal directly coupled to said corresponding input terminal, and a second terminal directly coupled to said corresponding output terminal.

* * * * *